(12) United States Patent  (10) Patent No.: US 7,999,615 B2
Litmanen et al.  (45) Date of Patent: Aug. 16, 2011

(54) CURRENT CANCELING VARIABLE GAIN AMPLIFIER AND TRANSMITTER USING SAME

(75) Inventors: Petteri Matti Litmanen, Richardson, TX (US); Siraj Akhtar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/008,489

(22) Filed: Jan. 18, 2011

(65) Prior Publication Data

US 2011/0124306 A1  May 26, 2011

Related U.S. Application Data

(62) Division of application No. 12/556,973, filed on Sep. 10, 2009, now Pat. No. 7,893,765.

(60) Provisional application No. 61/095,854, filed on Sep. 10, 2008, provisional application No. 61/095,869, filed on Sep. 10, 2008.

(51) Int. Cl.
*H03F 3/45* (2006.01)
(52) U.S. Cl. ........................................ 330/254; 330/278
(58) Field of Classification Search ............... 330/254, 330/278, 253
See application file for complete search history.

(56) References Cited

U.S. PATENT DOCUMENTS

| | | | |
|---|---|---|---|
| 5,834,951 A * | 11/1998 | Klein | 327/53 |
| 6,509,796 B2 | 1/2003 | Nguyen et al. | |
| 6,531,920 B1 | 3/2003 | Ishihara | |
| 7,026,856 B2 * | 4/2006 | D'Amico et al. | 327/352 |
| 7,420,423 B2 | 9/2008 | Lee et al. | |
| 7,482,798 B2 * | 1/2009 | Han | 323/316 |
| 7,653,372 B2 | 1/2010 | Yang et al. | |
| 7,728,668 B2 | 6/2010 | Okanobu | |

* cited by examiner

*Primary Examiner* — Henry K Choe
(74) *Attorney, Agent, or Firm* — Ronald O. Neerings; Wade James Brady, III; Frederick J. Telecky, Jr.

(57) ABSTRACT

A current canceling CMOS variable gain amplifier includes a first leg and a second leg. The first leg has a first input line, a first output line, a first ON transistor, a first control transistor and a first subtracting transistor. The second leg has a second input line, a second output line, a second ON transistor, a second control transistor and a second subtracting transistor. The second input line can provide a second input current. The second output line can provide a second output current. The first input line is arranged to provide a first input current to each of the first ON transistor, the first control transistor and the first subtracting transistor. The second input line is arranged to provide a second input current to each of the second ON transistor, the second control transistor and the second subtracting transistor. The first output line is in electrical connection with each of the first ON transistor, the first control transistor and the second subtracting transistor. The second output line is in electrical connection with each of the second ON transistor, the second control transistor and the first subtracting transistor.

17 Claims, 7 Drawing Sheets

CURRENT CANCELING VARIABLE GAIN AMPLIFIER AND TRANSMITTER USING SAME

This application is a Divisional of application Ser. No. 12/556,973 filed Sep. 10, 2009, now U.S. Pat. No. 7,893,765 which claims benefit under 35 U.S.C. §119(e) to U.S. provisional patent application 61/095,854, filed Sep. 10, 2008, and U.S. provisional patent application 61/095,869, filed Sep. 10, 2008, the entire disclosures of which are incorporated herein by reference.

BACKGROUND

In the middle of the twentieth century, comic strip detective Dick Tracy was famous for his two-way wrist radio. Comic strip readers probably considered that radio a fanciful invention of science fiction. Today, cellular telephones, wireless Internet connections, keyless automobile control, wireless game controllers, and many other everyday wireless devices have features that Dick Tracy would not have imagined. Today's wireless devices require small, low-cost integrated circuit transmitters, and they often use sophisticated methods of controlling the power output of the transmitter, for extending battery life and for transmitting data. They also need to work across different wireless standards and multiple frequency bands.

Figure 1:
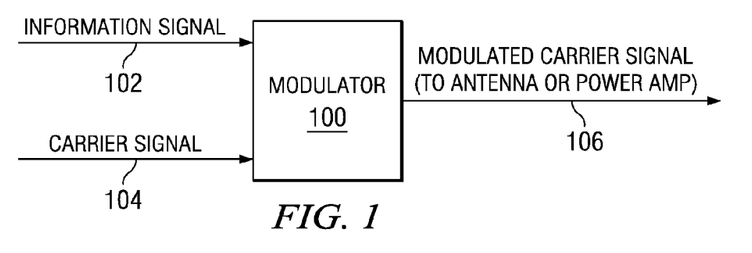
FIG. 1 illustrates a conceptual view of a modulator.

Modulation is the process of combining analog or digital data with a carrier signal for transmission. FIG. 1 illustrates a conceptual view of a modulator 100.

In operation, modulator 100 combines an information signal 102 with a carrier signal 104 to create a modulated carrier signal 106. Carrier signal 104 is often a radio frequency (RF) signal, but other carrier signals are possible. For example, the carrier signal could be coherent light from a laser.

Figure 2:
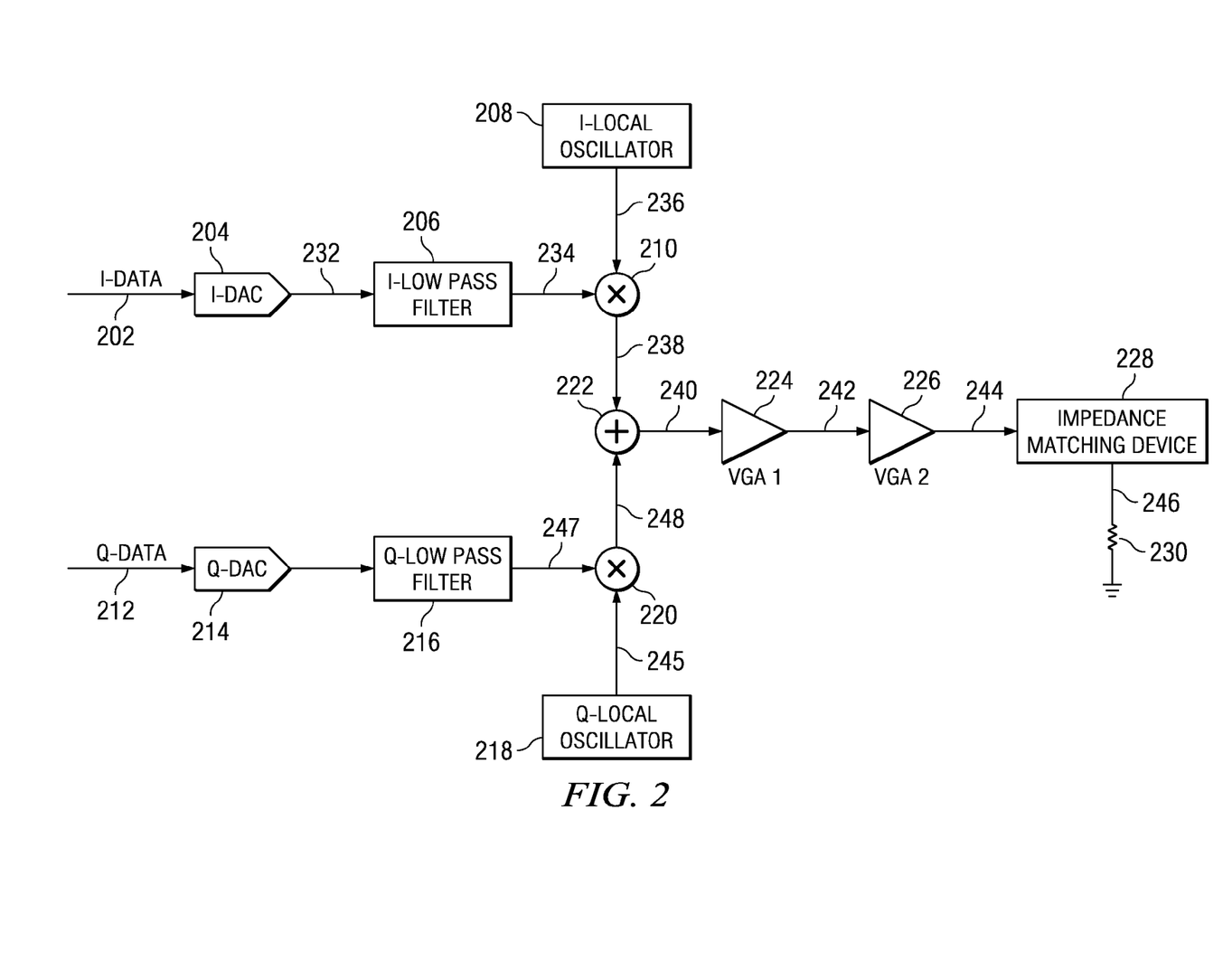
FIG. 2 illustrates a conventional integrated circuit transmitter with QAM.

FIG. 2 illustrates a conventional transmitter 200 with quadrature amplitude modulation (QAM). QAM is a method of sending two information signals on one carrier.

As illustrated in FIG. 2, transmitter 200 comprises a digital-to-analog converter (DAC) 204, a low pass filter 206, a local oscillator 208, a multiplier 210, a DAC 214, a low pass filter 216, a local oscillator 218, a multiplier 220, an adder 222, a variable gain amplifier (VGA) 224, a VGA 226, an impedance matching device 228 and a load 230. Load 230 could, for example, be an antenna or a power amplifier.

DAC 204 is arranged to receive I-Data 202 and to output a signal 232. Low pass filter 206 is arranged to receive signal 232 and output a signal 234. Local oscillator 208 is arranged to provide a carrier signal 236. Multiplier 210 is arranged to receive single 234 and carrier signal 236 and to output a signal 238.

DAC 214 is arranged to receive I-Data 212 and to output a signal 213. Low pass filter 216 is arranged to receive signal 213 and output a signal 247. Local oscillator 218 is arranged to provide a carrier signal 245. Multiplier 220 is arranged to receive signal 247 and carrier signal 245 and to output a signal 248.

Adder 222 is arranged to receive signal 238 and signal 248 and to output a signal 240. VGA 224 is arranged to receive signal 240 and to output a signal 242. VGA 226 is arranged to receive signal 242 and output a signal 244. Impedance matching device 228 is arranged to receive signal 244 and output a signal 246. Load 230 is arranged to receive signal 246 and is connected to ground.

In operation, local oscillators 208 and 218 both operate at the same carrier frequency at which transmitter 200 will be operating. Carrier signal 236 provided by local oscillator 208 is in quadrature with carrier signal 245 provided by local oscillator 218, meaning that carrier signals 236 and 245 have the same frequency but differ in phase by 90°. DAC 204, low pass filter 206 and multiplier 210 make up an in-phase leg of transmitter 200. DAC 214, low pass filter 216, oscillator 218 and multiplier 220 make up a quadrature leg of transmitter 200.

DAC 204 converts I-Data 202 data from digital to analog. Low pass filter 206 removes high frequency quantization noise from signal 232. Multiplier 210 multiplies signal 234 with carrier signal 236 to create signal 238, which is carrier signal 236 modulated by signal 234.

DAC 214 converts Q-Data 212 data from digital to analog. Low pass filter 216 removes high frequency quantization noise from signal 213. Multiplier 220 multiplies signal 247 with carrier signal 245 to create signal 248, which is carrier signal 245 modulated by signal 247.

Adder 222 creates signal 240 by adding signals 238 and 248. Signal 240 is amplified by VGA 224. Signal 242 is amplified by VGA 226. Both VGA 224 and VGA 226 provide gain control in the form of amplification or attenuation.

Transmitter 200 has several problems. If, for example, transmitter 200 is implemented as a conventional CMOS integrated circuit, many current-to-voltage and voltage-to-current conversions are required as signals move from the output of one functional block to the input of the next functional block. For example, a current-to-voltage conversion would be required at DAC 204 output, while low pass filter 206 needs to convert signal 234 from an input voltage to an input current. The input current needs to be converted to a voltage at the output of low pass filter 206 as signal 234. Current-to-voltage and voltage-to-current conversions introduce undesirable nonlinearities. These conversions also cause undesirable increases in power consumption and in noise, and these conversions have the undesirable side effect of increasing the number of devices needed in the integrated circuit.

If transmitter 200 is implemented in a technology other than bipolar transistors, problems arise in adjusting the gain of VGA 224 and VGA 226.

Figure 3:
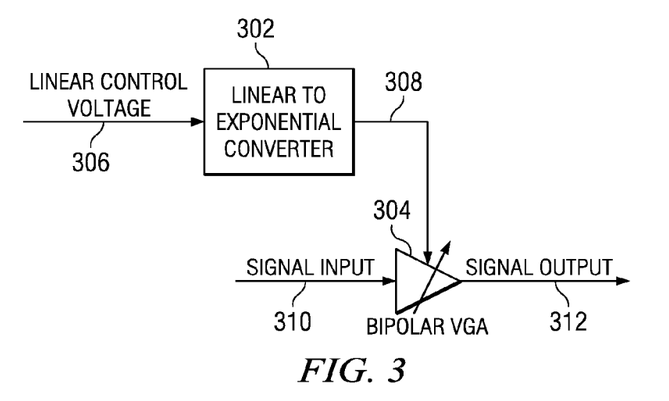
FIG. 3 illustrates a conventional system 300 used to control the gain of a VGA in a conventional transmitter.

FIG. 3 illustrates a conventional system 300 used to control the gain of a VGA in a conventional transmitter.

System 300 includes a linear to exponential converter 302 and a bipolar VGA 304. Converter 302 is arranged to receive a linear control voltage 306 and to output an exponential signal 308. Bipolar VGA 304 is arranged to receive an input signal 310 and output an amplified or attenuated signal 312.

In operation, converter 302 performs the mathematical function of taking the exponential value of linear control voltage 306. Exponential signal 308 is exponentially related to linear control voltage 306. Exponential signal 308 is used to control the gain of VGA 304.

Because the collector current of a bipolar transistor is exponentially related to the base-to-emitter voltage, converter 302 can be easily implemented with a bipolar transistor. In other technologies, however, a linear to exponential converter similar to 302 cannot be easily implemented.

The gain control of system 300 will now be described with reference to FIG. 4.

Figure 4:
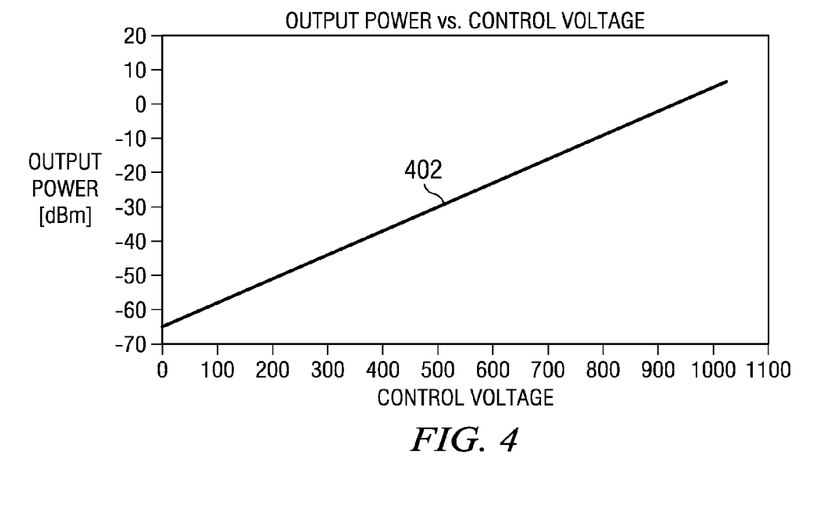
FIG. 4 is a graph, wherein the x-axis corresponds to linear control voltage and the y-axis is the gain of the VGA of FIG. 3.

FIG. 4 is a graph, wherein the x-axis corresponds to linear control voltage 306, and the y-axis is the output power of VGA 304. Arbitrary x-axis values are shown going from 0 to 1023 because it is assumed, for purposes of example, that linear control voltage 306 is provided by a 10-bit digital-to-analog converter. The y-axis units are dBm. The dBm scale is a logarithmic scale in which 1 milliwatt is taken as zero. A power P, in milliwatts, can be expressed as 10 log (P) dBm.

A line 402 in FIG. 4 is a straight line because the dBm scale is a logarithmic scale and because the output power from VGA 304 is proportional to the exponential of linear control voltage 306. This linear relationship between linear control voltage 306 and output power from VGA 304, expressed in dBm, is the desired relationship for transmitter 200.

Figure 5:
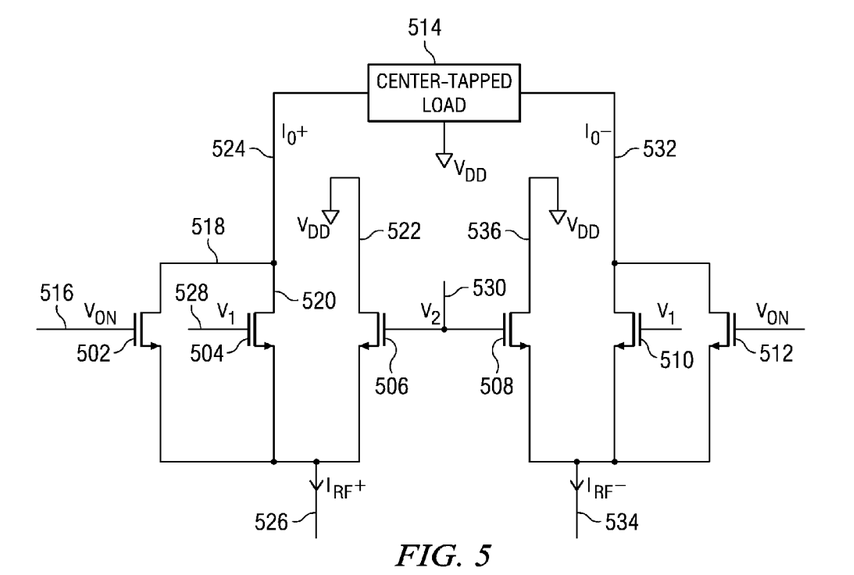
FIG. 5 illustrates an example of a CMOS VGA circuit using a conventional method for controlling power output.

FIG. 5 illustrates an example of a CMOS VGA circuit 500 using a conventional method for controlling power output.

As illustrated in FIG. 5, CMOS VGA circuit 500 includes NMOS FETs 502, 504, 506, 508, 510 and 512. CMOS VGA circuit 500 is connected to a center-tapped load 514.

The gates of FETs 502 and 512 are connected to a control voltage $V_{ON}$ 516. The gates of FETs 504 and 510 are connected to a control voltage $V_1$ 528. The gates of FETs 506 and 508 are connected to a control voltage $V_2$ 530. FETs 502 and 512 are each a single PET. Although FETs 504, 506, 508 and 510 are each illustrated as a single PET, each of FETs 504, 506, 508 and 510 is an arrangement of multiple (100 in this example) FETs. The number of FETs depend on the total desired gain control range.

Control voltage $V_{ON}$ 516 is at its maximum value whenever CMOS VGA circuit 500 is operational. When control voltage $V_1$ 528 is at its maximum value and control voltage $V_2$ 530 is at zero volts, no current flows through FET 506. In this case, a current $I_0^+$ 524 is equal to a current $I_{RF}^+$ 526. Similarly, when control voltage $V_1$ 528 is at its maximum value and control voltage $V_2$ 530 is at zero volts, no current flows through PET 508. In this case, a current $I_0^-$ 532 is equal to a current $I_{RF}^-$ 534.

Further, when control voltage $V_1$ 528 is at its maximum value and control voltage $V_2$ 530 is zero. CMOS VGA circuit 500 provides maximum power to load 514. FET 504, which is controlled by control voltage $V_1$ 528, is an arrangement of 100 FETs and FET 506, which is controlled by control voltage $V_{ON}$ 516, is a single FET. So when control voltage $V_1$ 528 is at its maximum value and control voltage $V_2$ 530 is at zero volts, 101 FETs are providing gain. If FET 502 and each device within FET 504 have a transconductance of $G_m$, the total transconductance is $101G_m$.

To begin decreasing the power delivered to load 514, control voltage $V_2$ 530 is increased. When control voltage $V_2$ 530 reaches its maximum value, current $I_{RF}^+$ 526 splits up among FETs 502, 504 and 506. Because FETs 504 and 506 are, in actuality, each 100 FETs, the current division is such that 100/201 of current $I_{RF}^+$ 526 flows in a path 520 through FET 504, another 100/201 of the current flows in a path 522 through FET 506 and 1/201 of the current flows in a path 518 through FET 502.

Because of the symmetry of CMOS VGA circuit 500, similar current division occurs for $I_{RF}^-$ 534. This means that 101/201 of the current now flows through load 514. The other 100/201 of the current now flows in path 522 through FET 506 and in path 536 through FET 508. This means that when control voltage $V_2$ 530 reaches its maximum value, the current delivered to load 514 is about ½ of the maximum possible current. This change in current corresponds to a change in power of about 6 dB because the power is proportional to the square of the current.

As shown in FIG. 4, output changes of much more than 6 dB are needed, but changing control voltage $V_2$ 530 from zero to its maximum value causes a change of only about 6 dB. Further changes in power output require changing control voltage $V_1$ 528.

For CMOS VGA circuit 500, changing control voltage $V_2$ 530 from zero to its maximum value results in a decrease in output power of only 6 dB. Further decreases in output power require a decrease in control voltage $V_1$ 528. To decrease power by much more than 6 dB, most of the decrease in output power will have to come from decreasing control voltage $V_1$ 528.

If all of the FETs in CMOS VGA circuit 500 were turned OFF, $I_0^+$ 524, $I_{RF}^+$ 526, $I_0^-$ 532 and $I_{RF}^-$ 534 would, in theory, all be zero. Because the FETs in CMOS VGA circuit 500 are not ideal, their leakage will cause this minimum value to be nonzero and not well-controlled. Because this current is not well-controlled, $V_{ON}$ 516 is always kept at its maximum value. The minimum value of $I_0^+$ 524 then occurs when FET 504 is turned OFF and FET 506 is fully ON. Similarly, the minimum value of $I_0^-$ 532 occurs when FET 510 is turned OFF and FET 508 is fully ON. Since FETs 502 and 512 are single FETs but FETs 506 and 508 are, in fact, each an arrangement of 100 FETs, the minimum possible current through load 514 is 1/101 of the maximum possible current. The minimum possible current of about 1/100 of the maximum possible current corresponds to a power difference, from a maximum to a minimum power, of about 40 dB.

In CMOS VGA circuit 500, varying control voltage $V_2$ 530 through its entire range results in a power change of 6 dB. As discussed above, the total power range of the circuit is about 40 dB. Of this 40 dB, about 34 dB conies from varying control voltage $V_1$ 528. This means that a linear relationship, like one shown in FIG. 4, cannot be obtained with CMOS VGA circuit 500.

FIG. 2 shows a conventional transmitter and FIG. 5 shows a conventional method of controlling the gain when an amplifier in the conventional transmitter is not implemented with bipolar transistors and is, for example, implemented in CMOS. As explained above, voltage-to-current and current-to-voltage conversions in transmitter 200 cause many undesirable results. Also as explained above, the conventional gain control method of FIG. 5 does not give the desired gain curve shown in FIG. 4.

What is needed is a transmitter that eliminates the undesirable results caused by voltage-to-current and current-to-voltage conversions and that also provides a gain curve similar to the one shown in FIG. 4.

BRIEF SUMMARY

It is an object of the present invention to provide a transmitter that eliminates the undesirable results caused by voltage-to-current and current-to-voltage conversions and that also provides a gain curve similar to the one shown in FIG. 4.

In accordance with an aspect of the present invention, a current canceling CMOS variable gain amplifier includes a first leg and a second leg. The first leg has a first input line, a first output line, a first ON transistor, a first control transistor and a first subtracting transistor. The second leg has a second input line, a second output line, a second ON transistor, a second control transistor and a second subtracting transistor. The second input line can provide a second input current. The second output line can provide a second output current. The first input line is arranged to provide a first input current to each of the first ON transistor, the first control transistor and the first subtracting transistor. The second input line is arranged to provide a second input current to each of the second ON transistor, the second control transistor and the second subtracting transistor. The first output line is in electrical connection with each of the first ON transistor, the first control transistor and the second subtracting transistor. The second output line is in electrical connection with each of said second ON transistor, said second control transistor and said first subtracting transistor.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with an aspect of the present invention, an example CMOS transmitter eliminates the problems caused by voltage-to-current and current-to-voltage conversions. The example CMOS transmitter also solves the problem of providing a linear relationship between power output in dBm and control voltage when bipolar transistors are not used to provide linear to exponential conversion of the control voltage.

The example CMOS transmitter avoids the problems caused by voltage-to-current and current-to-voltage conversion because the example CMOS transmitter has no such conversions. In accordance with an aspect of the present invention, all of the circuit portions within the modulator as well as the first amplifier in an example CMOS transmitter accept current as input and provide current as output. Accordingly, in an example CMOS transmitter in accordance with an aspect of the present invention, no voltage-to-current conversions and no current-to-voltage conversions are required between functional blocks.

The problem of providing a linear relationship between output power in dBm and control voltage is solved by using a current canceling amplifier that provides a curve similar to the one shown in FIG. 4. Because the curve is similar, but not identical, to the shape shown in FIG. 4, a lookup table may be used to provide the needed corrections.

Aspects of the present invention will now be further described with reference to FIGS. 6-10.

Figure 6:
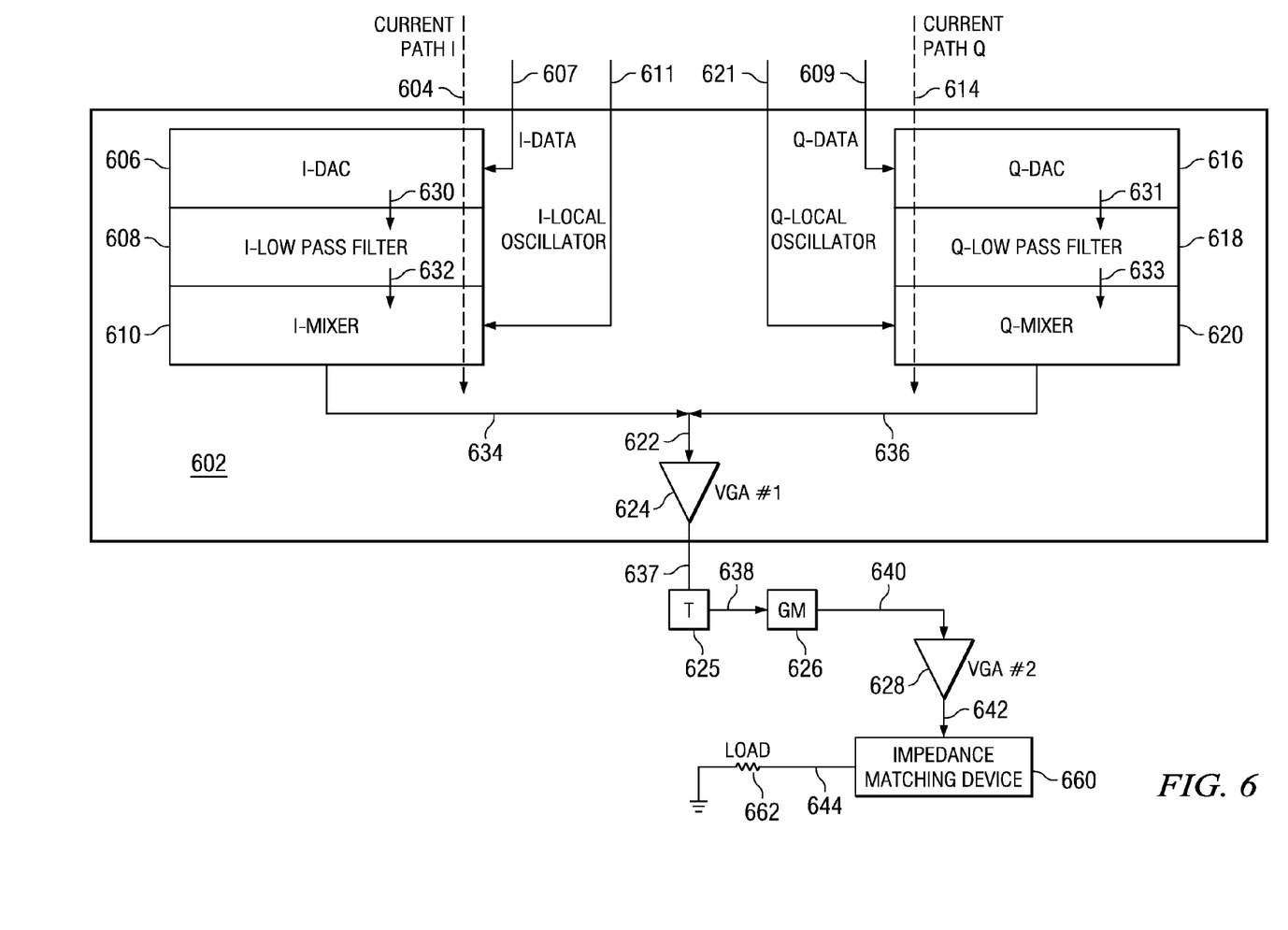
FIG. 6 illustrates an example quadrature modulation transmitter in accordance with an aspect of the present invention.

FIG. 6 illustrates an example quadrature modulation transmitter 600 in accordance with an aspect of the present invention.

Transmitter 600 includes a first amplification stage 602, a transformer 625, a transconductance amplifier 626, a VGA 628, an impedance matching device 660 and a load 662. First amplification stage 602 includes a DAC 606, a DAC 616, a low pass filter 608, a low pass filter 618, a mixer 610, a mixer 620 and a VGA 624.

First amplification stage 602 is arranged to receive data 607, data 609, a local oscillator signal 611 and a local oscillator signal 621. First amplification, stage 602 is additionally arranged to output a current 637. Transformer 625 is arranged to receive current 637 and output a voltage 638. Transformer 625 provides impedance matching between VGA 624 and transconductance amplifier 626. Transconductance amplifier 626 is arranged to receive voltage 638 and to output a current 640. VGA 628 is arranged to receive current 640 and to output a current 642. Impedance matching device 660 is arranged to receive current 642 and to output a voltage 644. Load 662 is arranged to receive voltage 644.

Within first amplification stage 602, DAC 606 is arranged to receive data 607 from an external source and to output a current 630. Low pass filter 608 is arranged to receive current 630 from DAC 606 and to output a current 632. Mixer 610 is arranged to receive current 632 from low pass filter 608. Mixer 610 is also arranged to receive local oscillator signal 611 from an external source and to output a current 634.

Within first amplification stage 602, DAC 616 is arranged to receive data 609 from an external source and to output a current 631. Low pass filter 618 is arranged to receive current 631 from DAC 616 and to output a current 633. Mixer 620 is arranged to receive current 633 from low pass filter 618. Mixer 620 is also arranged to receive local oscillator signal 621 from an external source and to output a current 636.

VGA 624 is arranged to receive a current 622 as a combination of current 634 and current 636 and to output current 638.

The operation of transmitter 600 will now be explained with additional reference to FIG. 2.

In operation, local oscillator signal 611 and local oscillator signal 621 are both at a carrier frequency at which transmitter 600 will be operating. Local oscillator signal 611 is in quadrature with local oscillator signal 621, meaning that local oscillator signals 611 and 621 have the same frequency but differ in phase by 90°. DAC 606, low pass filter 608 and mixer 610 make up an in-phase leg of transmitter 600. DAC 616, low pass filter 618 and mixer 620 make up a quadrature leg of transmitter 600. A current path 604 exists through the in-phase leg of transmitter 600, and a current path 614 exists through the quadrature leg of transmitter 600.

DAC 606 converts data 607 from digital to analog data as current 630. Low pass filter 608 removes high frequency noise from current 630. Mixer 610 combines the filtered current 632 with local oscillator signal 611 to create current 634, which is local oscillator signal 611 modulated by data 607.

DAC 616 converts data 609 data from digital to analog data as current 631. Low pass filter 618 removes high frequency noise from current 631. Mixer 620 combines current 633 with local oscillator signal 621 to create current 636, which is local oscillator signal 611 modulated by data 609.

Current 634 and current 636 combine to create current 622. VGA 624 amplifies/attenuates current 622 and outputs current 638. Transformer 625 matches the output impedance of VGA 624 to the input impedance of transconductance amplifier 626. Transconductance amplifier 626 accepts voltage 638 and outputs current 640. VGA 628 amplifies/attenuates current 640 and outputs current 642. Impedance matching device 660 matches the output impedance of VGA 628 to the impedance of load 662. Impedance matching device 660 also matches the balanced output of VGA 628 to the unbalanced load 662.

If the output of VGA 624 is sufficient, transconductance amplifier 626 and VGA 628 can be eliminated, in which case current 638 from VGA 624 would be connected directly to impedance matching device 660.

Impedance matching device 660 and load 662 are of conventional design, and they serve the same function as impedance matching device 228 and load 230, respectively, of transmitter 200.

DACs 606 and 616 provide a current output with no internal voltage-to-current conversions and no internal current-to-voltage conversions. Low pass filter 608 and low pass filter 618 are designed to accept current inputs. There are no voltage-to-current conversions and no current-to-voltage conversions between DAC 606 and low pass filter 608. Similarly, there are no voltage-to-current conversions and no current-to-voltage conversions between DAC 616 and low pass filter 618. Further, low pass filter 608 and low pass filter 618 are designed to provide a current output with no internal voltage-to-current conversions and no internal current-to-voltage conversions. Mixers 610 and 620 are designed to accept current as input and provide current as output with no internal voltage-to-current conversions and no internal current-to-voltage conversions.

In FIG. 6, current path 604 shows the path of current flowing with no voltage-to-current conversions and no current-to-voltage conversions in the in-phase leg of transmitter 600. Current path 614 shows the path of current flowing with no voltage-to-current conversions and no current-to-voltage conversions in the quadrature leg of transmitter 600. There are no voltage-to-current conversions and no current-to-voltage conversions along either of these paths. There are no voltage-to-current conversions and no current-to-voltage conversions within DACs 606 and 616, low pass filters 608 and 618, mixers 610 and 620 and VGA 624.

Because there are no voltage-to-current conversions and no current-to-voltage conversions within DACs 606 and 616, low pass filters 608 and 618, mixers 610 and 620 and VGA 624, the problems associated with transmitter 200 caused by such conversions do not occur in transmitter 600.

VGA 624 and VGA 628 may be, in an example embodiment, implemented as current canceling VGAs. Such an implementation addresses the mentioned gain control problems of CMOS VGA circuit 500 of FIG. 5. Current canceling VGAs are another aspect of the present invention as will be discussed below.

Figures 7, 7A:
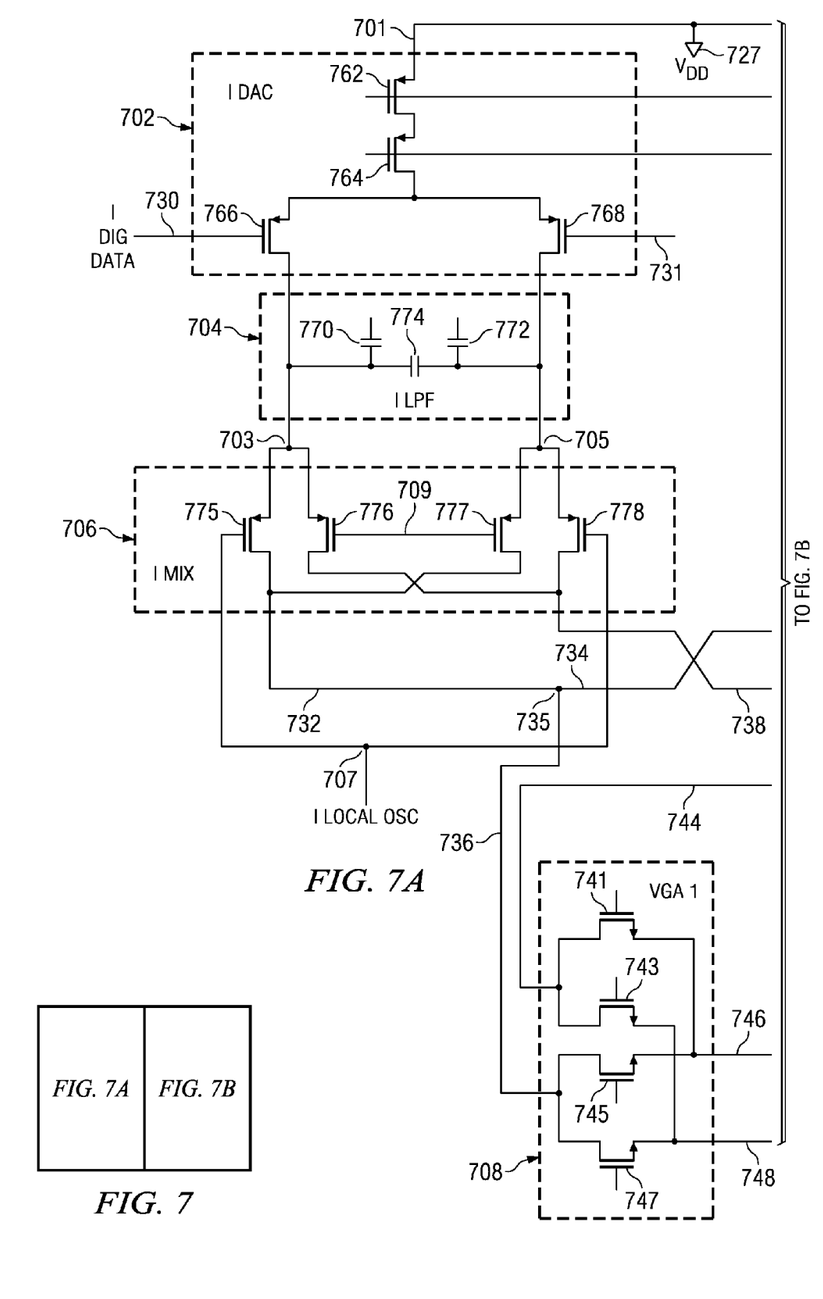
FIG. 7 illustrates an example embodiment of a CMOS transmitter in accordance with an aspect of the present invention.
Figure 7B:
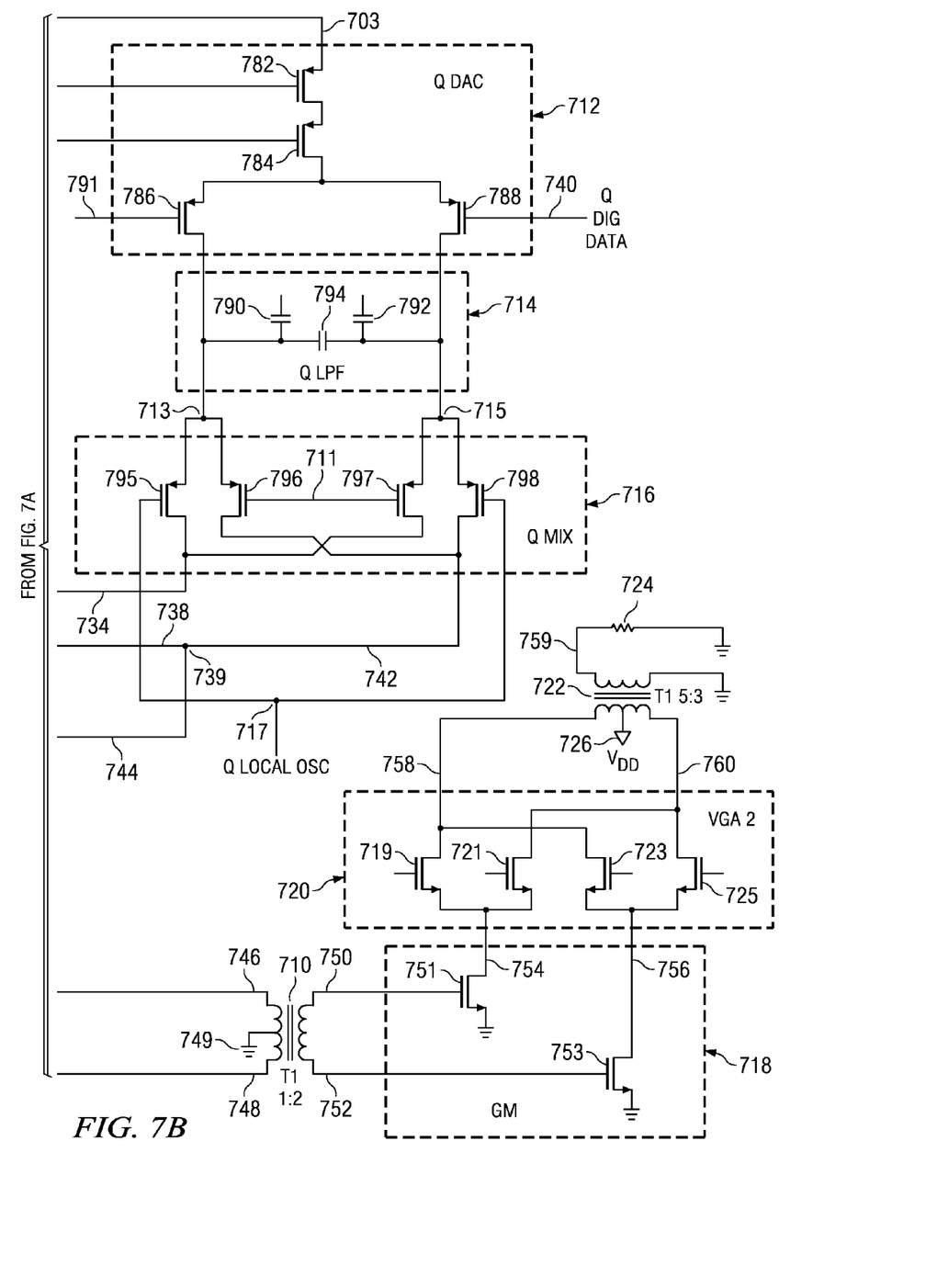

FIG. 7 illustrates an example embodiment of a CMOS transmitter 700 in accordance with an aspect of the present invention. CMOS transmitter 700 is an example implementation of transmitter 600 of FIG. 6.

As illustrated in FIG. 7, CMOS transmitter 700 includes a DAC 702, a low pass filter 704, a mixer 706, a VGA 708, a DAC 712, a low pass filter 714, a mixer 716, a current junction 735, a current junction 739, a transformer 710, a transconductance amplifier 718, a VGA 720, a transformer 722 and a load 724.

DAC 702 includes an FET 762, an HT 764, an FET 766 and an FET 768. Low pass filter 704 includes a capacitor 770, a capacitor 772 and a capacitor 774. Mixer 706 includes an FET 775, an FET 776, an FET 777 and an FET 778.

DAC 712 includes an FET 782, an PET 784, an FET 786 and an FET 788. Low pass filter 714 includes a capacitor 790, a capacitor 792 and a capacitor 794. Mixer 716 includes an PET 795, an FET 796, an PET 797 and an FET 798.

VGA 708 includes an FET 741, an PET 743, an FET 745 and an FET 747. Transconductance amplifier 718 includes an FET 751 and an FET 753. VGA 720 includes an PET 719, an FET 721, an FET 723 and an FET 725.

Within DAC 702, FET 762 and FET 764 are arranged as a current source that provides a current at the drain of FET 764. FET 766 is arranged to receive current from the drain of FET 764 at its source and to receive a stream of digital data 730 at its gate. PET 768 is arranged to receive current from the drain of PET 764 at its source and to receive a stream of digital data 731 at its gate. Because this is a balanced system, digital data 731 has an opposite polarity of digital data 730. FET 766 is arranged to supply an analog current at its drain, and FET 768 is arranged to supply an analog current at its drain.

Within low pass filter 704, capacitor 770, capacitor 772 and capacitor 774 are arranged to receive current from FET 766 and FET 768 and to supply current to the sources of FETs 775, 776, 778 and 779.

Within mixer 706, FETs 775 and 776 are arranged to receive at their sources a current 703 from low pass filter 704. FETs 777 and 778 are arranged to receive at their sources a current 705 from low pass filter 704. FET 775 is arranged to receive a local oscillator signal 707 at its gate, and FET 778 is arranged to receive local oscillator signal 707 at its gate. Local oscillator signal 707 is a balanced signal, and the gates of FETs 776 and 777 are arranged to receive a signal 709, which is 180° out of phase from local oscillator signal 707. The drains of FETs 775 and 777 are arranged to provide a current 732. The drains of FETs 776 and 778 are arranged to provide a current 738.

Within DAC 712, FET 782 and FET 784 are arranged as a current source that provides a current at the drain of FET 784. FET 788 is arranged to receive current from the drain of FET 784 at its source and to receive a stream of digital data 740 at its gate. FET 786 is arranged to receive current from the drain of FET 784 at its source and to receive a stream of digital data 791 at its gate. Because this is a balanced system, digital data 791 has an opposite polarity of digital data 740. FET 788 is arranged to supply an analog current at its drain, and FET 786 is arranged to supply an analog current at its drain.

Within low pass filter 714, capacitor 790, capacitor 792 and capacitor 794 are arranged to receive current from FET 788 and FET 786 and to supply current to the sources of FETs 798, 797, 796 and 795.

Within mixer 716, FETs 795 and 796 are arranged to receive at their sources a current 713 from low pass filter 714. FETs 797 and 798 are arranged to receive at their sources a current 715 from low pass filter 714. FET 795 is arranged to receive a local oscillator signal 717 at its gate, and FET 798 is arranged to receive a local oscillator signal 717 at its gate. Local oscillator signal 717 is a balanced signal, and the gates of FETs 796 and 797 are arranged to receive a signal 711, which is a 180° out of phase version of local oscillator signal 717. The drains of FETs 795 and 797 are arranged to together provide a current 734. The drains of FETs 796 and 798 are arranged to together provide a current 742. Local oscillator signals 707 and 717 are 90° out of phase. Local oscillator signals 709 and 711 are 90° out of phase.

Current junction 735 is arranged to receive current 732 and current 734 and to output a current 736. Current junction 739 is arranged to receive current 738 and current 742 and to output a current 744.

Within VGA 708, FETs 741 and 743 are arranged to receive current 744. FETs 745 and 747 are arranged to receive current 736. FETs 741 and 745 are arranged to together output a current 746. FETs 743 and 747 are arranged to together output a current 748. With this arrangement, VGA 708 is a current canceling VGA. Current canceling VGAs are an aspect of the present invention and will be discussed in more detail later.

Transformer 710 is arranged to receive at its primary currents 746 and 748, which are balanced with respect to a ground node 749. Transformer 710 is also arranged, by correctly configuring its' turns ratio, to output at its secondary winding, a voltage 750 and a voltage 752, which voltages are measured with respect to ground node 749. Transformer 710 turns ratio provides impedance matching between VGA 708 and transconductance amplifier 718.

Within transconductance amplifier 718, FET 751 is arranged to receive voltage 750 and to output a current 754. FET 753 is arranged to receive voltage 752 and to output a current 756.

Within VGA 720, FETs 719 and 721 are arranged to receive current 754. FETs 723 and 725 are arranged to receive current 756. FETs 719 and 723 are arranged to together output a current 758. FETs 721 and 725 are arranged to together output a current 760. With this arrangement, VGA 720 is another current canceling VGA, which will be discussed in more detail later.

Transformer 722 is arranged, by properly configuring its' turns ratio, to provide impedance matching between VGA 720 and load 724. Transformer 722 also provides balanced to unbalanced signal conversion for the single ended load 724.

Operation of CMOS transmitter 700 will now be described in greater detail.

DAC 702 converts digital data 730 from digital to analog, and DAC 712 converts digital data 740 from digital to analog. DACs 702 and 712 are designed to convert a digital input directly to a differential output current. Low pass filter 704 removes high frequency noise from the output of DAC 702. Low pass filter 714 performs a similar function for DAC 712. Low pass filters 704 and 714 operate in the current domain and perform no voltage-to-current conversions and no current-to-voltage conversions.

Mixer 706 will now be explained with additional reference to FIGS. 1 and 2. Mixer 706 combines data, in the form of currents at 703 and 705, with local oscillator signal 707. Currents 703 and 705 together correspond to information signal 102 of modulator 100 of FIG. 1 and to signal 234 of transmitter 200 of FIG. 2. Local oscillator signal 707 corresponds to carrier signal 104 in modulator 100 of FIG. 1 and to carrier signal 236 of transmitter 200 of FIG. 2. Currents at 732 and 738 together correspond to modulated carrier signal 106 of modulator 100 of FIG. 1 and to signal 238 of transmitter 200 of FIG. 2.

As previously explained, local oscillator signal 707 is a balanced signal, and signal 717 is the quadrature version of local oscillator signal 707. When local oscillator signal 707 is positive with respect ground node 749, signal 709 is negative with respect to ground node 749, and vice versa. When local oscillator signal 707 is positive with respect to ground node 749, FETs 775 and 778 are OFF, and FETs 776 and 777 are ON. In this case, current 732 is the same as current 705, and current 738 is the same as current 703. When local oscillator signal 707 is negative with respect to ground node 749, FETs 776 and 777 are OFF, and FETs 775 and 778 are ON. In this case, current 732 is the same as current 703, and current 738 is the same as current 705.

When local oscillator signal 707 is positive with respect to ground node 749, the differential current flowing out of mixer 706 is the differential input current multiplied by one (1). When local oscillator signal 707 is negative with respect to ground node 749, the differential current flowing out of mixer 706 is the differential input current multiplied by negative one (−1). For a square wave local oscillator signal 707, these multiplications are equivalent to multiplying the input of mixer 706 by local oscillator signal 707 times a constant.

Mixer 706 is known as a Gilbert cell mixer. Mixer 706 corresponds to multiplier 210 of transmitter 200 of FIG. 2. Other embodiments may include other known mixers, non-limiting examples of which include a current commutating mixer and an I/Q rejection mixer.

Mixer 716 performs the same function as mixer 706 except that its data is in the form of currents 713 and 715 and its oscillator signal is 717.

Current junctions 735 and 739 together correspond to adder 222 in FIG. 2.

Currents 746 and 748 are the output of VGA 708. Currents 746 and 748 flow into ground node 749, completing current flow from the $V_{DD}$ node 727 to ground node 749. In accordance with an aspect of the present invention, current flows from $V_{DD}$ node 727 to ground node 749 with no intervening current-to-voltage conversions and with no intervening voltage-to-current conversions.

Transformer 722 converts the output of VGA 720 from balanced to unbalanced with respect to ground and matches the impedance of load 724.

If the output power of VGA 708 is sufficient for a particular application, transformer 710 could be used to match the output of VGA 708 to a load. In that case, transconductance 718, VGA 720 and transformer 722 would not be needed.

In the embodiment shown in FIG. 7, DAC 702, DAC 712, mixer 706 and mixer 716 are all implemented in PMOS, whereas VGA 708 is implemented in NMOS. In another example embodiment, DAC 702, DAC 712, mixer 706 and mixer 716 may all be implemented in NMOS, whereas VGA 708 would be implemented in PMOS. In such an embodiment, ground node 749 in FIG. 7 would be changed to a $V_{DD}$ node, and $V_{DD}$ node 727 would be changed to a ground node. Other combinations of NMOS and PMOS devices can also be utilized to implement DAC 702 and DAC 712, LPF 704 and 714, mixer 706 and 716 and VGA 708.

FIG. 7 is an example embodiment of a CMOS transmitter in accordance with an aspect of the present invention. Other example embodiments of a transmitter in accordance with the present invention may comprise other semiconducting devices, non-limiting examples of which include bipolar devices and gallium arsenide devices.

A portion of the example embodiment shown in FIG. 7 will be described with additional reference to FIG. 6.

DACs 702 and 712 correspond to DACs 606 and 616 respectively. Low pass filters 704 and 714 correspond to low pass filters 608 and 618, respectively. Mixers 706 and 716 correspond to mixers 610 and 620 respectively. VGA 708 corresponds to VGA 624. DACs 702 and 712, low pass filters 704 and 714, mixers 706 and 716 and VGA 708 together correspond to first amplification stage 602. There are no current-to-voltage conversions and no voltage-to-current conversions in the circuits that correspond to first amplification stage 602.

Data 607 and data 609 correspond to digital data 730 and digital data 740, respectively. Local oscillator signal 611 and local oscillator signal 621 correspond to local oscillator signal 707 and local oscillator signal 717, respectively.

Current flowing along current path 604 in FIG. 6 corresponds to current flowing from VET source 701 to current junction 735 and current junction 739. Current flowing along current path 614 in FIG. 6 corresponds to current flowing from FET source 703 to current junction 735 and current junction 739.

In CMOS transmitter 700, VGA 708 and VGA 720 are implemented as current canceling VGAs. Current canceling VGAs provide better gain control linearity than conventional VGAs such as CMOS VGA circuit 500 of FIG. 5.

Figure 8:
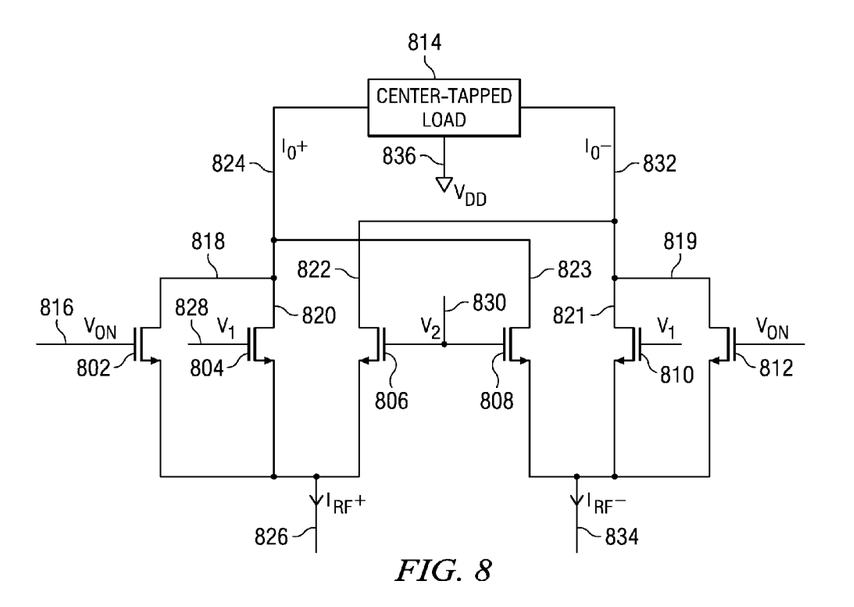
FIG. 8 illustrates an example current canceling VGA 800 in accordance with an aspect of the present invention.

FIG. 8 illustrates an example current canceling VGA 800 in accordance with an aspect of the present invention.

As illustrated in FIG. 8, current canceling VGA 800 includes an FET 802, an FET 804, an FET 806, an FET 808, an FET 810 and an VET 812. FIG. 8 also shows a center-tapped load 814. Load 814 is not part of current canceling VGA 800.

FET 802 is arranged to receive a control voltage $V_{ON}$ 816 at its gate and to output a current 818 at its drain. FET 804 is arranged to receive a control voltage $V_1$ 828 at its gate and to output a current 820 at its drain. FET 806 is arranged to receive a control voltage $V_2$ 830 at its gate and to output a current 822 at its drain. The sources of FETs 802, 804 and 806 are arranged to receive current from a current $I_{RF}^+$ 826.

FET 808 is arranged to receive a control voltage $V_2$ 830 at its gate and to output a current 823 at its drain. FET 810 is arranged to receive a control voltage $V_1$ 828 at its gate and to output a current 821 at its drain. FET 812 is arranged to receive a control voltage $V_{ON}$ 816 at its gate and to output a current 819 at its drain. The sources of FETs 808, 810 and 812 are arranged to receive current from a current $I_{RF}^-$ 834.

Load 814 is arranged to receive a current $I_0^+$ 824 and a current $I_0^-$ 832. Current $I_0^+$ 824 and current $I_0^-$ 832 both flow into the $V_{DD}$ node 836.

Control voltage $V_{ON}$ 816 is connected to the gates of FETs 802 and 812. Control voltage $V_1$ 828 is connected to the gates of FETs 804 and 810, and control voltage $V_2$ 830 is connected to the gates of FETs 806 and 808. Although FETs 802, 804, 806, 808, 810 and 812 are each illustrated as a single FET, FETs 804, 806, 808 and 810 are, in fact, each an arrangement of 50 FETs, whereas each of FETs 802 and 812 are, in fact, an arrangement of 51 FETs. The actual number of FETs depend on the desired total gain control range, however the difference of number of FETs between 802 and 804, and between 802 and 806 is 1. The difference of number of FETs between 812 and 810, and between 812 and 808 is 1.

When voltage $V_1$ 828 is at its maximum value and voltage $V_2$ 830 is at zero volts, no current flows through FETs 806 and 808, and current $I_0^+$ 824 is equal to current $I_{RF}^+$ 826. Similarly, when voltage $V_1$ 828 is at its maximum value and voltage $V_2$ 830 is at zero volts, current $I_0^-$ 832 is equal to current $I_{RF}^-$ 834. When voltage $V_1$ 828 is maximum and voltage $V_2$ 830 is zero, as just described, current canceling VGA 800 provides maximum power to load 814.

To begin decreasing the power delivered to load 814, voltage $V_2$ 830 is increased. As voltage $V_2$ 830 is increased from zero, current $I_0^+$ 824 originates from FETs 802, 804 and 808. Current $I_0^-$ 832 originates in a similar way from FETs 806, 810 and 812. Because FET 808 provides cross coupling between current $I_0^+$ 824 and current $I_{RF}^-$ 834, a negative current is added to current $I_0^+$ 824. Because FET 802 is actually 51 FETs and because FETs 804, 806 and 808 are actually 50 FETs, the current division and redirection is such that when $V_2$ 830 reaches its maximum value, which is equal to the maximum value of voltage $V_1$ 828, current $I_0^+$ 824 is 51/151 of current $I_{RF}^+$ 826. Similarly, current $I_0^-$ 832 is 51/151 of current $I_{RF}^-$ 834. This means that when voltage $V_1$ 828 and voltage $V_2$ 830 are equal and are at their maximum values, the change in current $I_0^+$ 824 and current $I_0^-$ 832 corresponds to change in power of 10(log(51/151)) dB, which is a change of approximately 9.5 dB because power is proportional to the square of the current.

One of the advantages of current canceling VGA 800 will now be described with additional reference to FIGS. 4 and 5.

CMOS VGA circuit 500 of FIG. 5 provides a change of power output of 6 dB when control voltage $V_1$ 528 is at its maximum value and control voltage $V_2$ 530 is changed from zero to its maximum, wherein further changes in power output require changing control voltage $V_1$ 528. This means that a linear relationship, like the one shown in FIG. 4, between control voltage and output power in dBm cannot be obtained with CMOS VGA circuit 500.

On the other hand, current canceling VGA 800 provides a change of power output of 9.5 dB when voltage $V_1$ 828 is at its maximum and voltage $V_2$ 830 is changed from zero to its maximum, wherein further changes in power output require changing voltage $V_1$ 828. Although current canceling VGA 800 does not provide a perfectly linear curve like the one shown in FIG. 4, it provides an improved curve when compared to CMOS VGA circuit 500 of FIG. 5. As will be described later, the output power versus control voltage curve for current canceling VGA 800 can be further improved, in accordance with another aspect of the present invention.

Another advantage of current canceling VGA 800 will now be described with reference to CMOS VGA circuit 500 of FIG. 5.

In CMOS VGA circuit 500, FETs 502, 504 and 506 include a total of 201 FETs and provide a maximum transconductance of $101G_m$. For current canceling VGA 800, FETs 802, 804 and 806 include a total of only 151 FETs and provide a maximum transconductance of $(51+50)G_m$, which equals $101G_m$. Current canceling VGA 800 uses fewer devices than CMOS VGA circuit 500, but provides the same maximum transconductance. The decreased number of devices decreases capacitance, power dissipation and physical size of the circuit.

In both VGA 800 and VGA 500, the minimum current that flows through loads 814 and 514 is 1/101 on input current $I_{RF}^+$ or $I_{RF}^-$. The total gain control range (dynamic range) is 40 dB.

Figure 9:
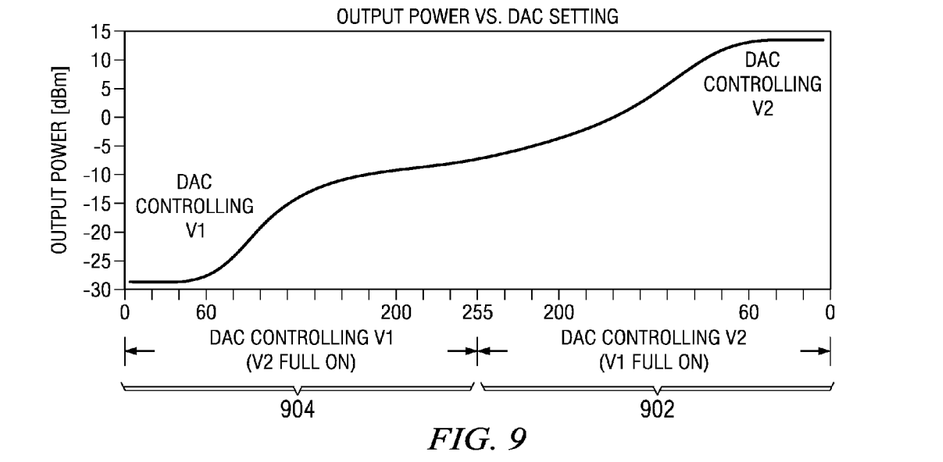
FIG. 9 a graph, wherein the x-axis corresponds to linear control voltage and the y-axis is the output power of VGA 800.

FIG. 9 will now be described with additional reference to current canceling VGA 800.

FIG. 9 is a graph, wherein the x-axis corresponds to control voltages $V_2$ 830 and $V_1$ 828 and the y-axis corresponds to the power output of current canceling VGA 800 in units of dBm. The right half 902 of the x-axis shows control codes when an 8-bit DAC is used to control $V_2$ 830. The left half 904 of the x-axis shows control codes when an 8-bit DAC is used to control $V_1$ 828. The control codes on right half 902 increase from right to left, whereas the control codes on left half 904 increase from left to right.

FIG. 9 shows that the shape of the curve of output power in dBm as a function of control codes for VGA 800 is similar, but not identical, to the desired curve shape shown in FIG. 4. A system for controlling VGA 800 to make FIG. 9 linear like FIG. 4 is an aspect of the present invention and will now be discussed.

Figure 10:
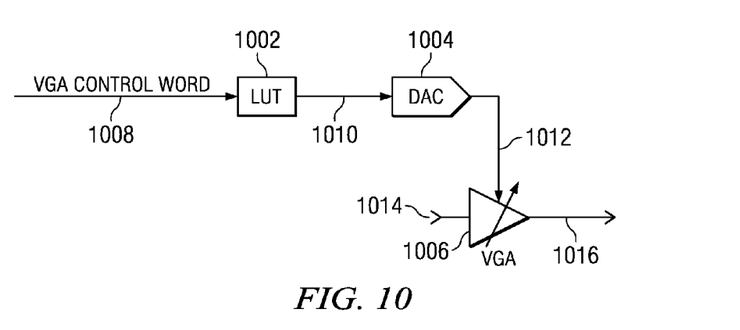
FIG. 10 illustrates an example system for controlling a current canceling VGA, in accordance with an aspect of the present invention, to make to make the output power in dBm linearly proportional to a control code.

FIG. 10 illustrates an example system 1000 for controlling a current canceling VGA 800 in accordance with an aspect of the present invention, to make the output power in dBm linearly proportional to a control code.

As illustrated in FIG. 10, system 1000 includes a lookup table (LUT) 1002, a DAC 1004 and a VGA 1006.

Lookup table 1002 is arranged to receive a VGA control word 1008 and to output a control code 1010. DAC 1004 is arranged to receive control code 1010 and to output a control voltage 1012. Current canceling VGA 1006 is arranged to receive control voltage 1012 and a signal 1014 and to output a signal 1016.

In accordance with an aspect of the present invention, because voltage $V_1$ 828 is adjusted only when voltage $V_2$ 830 is at its minimum, only one DAC is required for the control of these two signals. DAC 1004 is switched between voltage $V_2$ 830 and voltage $V_1$ 828 depending on which one is being adjusted.

The operation of system 1000 will now be explained with additional reference to FIGS. 4, 8 and 9.

FIG. 9 shows output power in dBm as a function of control voltage for current canceling VGA 800. The right half 902 of FIG. 9 shows, going from right to left, the decrease in output power as $V_2$ 830 is increased from zero to its maximum value while $V_1$ 828 is at its maximum. The left half 904 of FIG. 9 shows, going from right to left, the decrease in output power as $V_1$ 828 is decreased from its maximum value to zero while $V_2$ 830 is zero. Look up table 1002 converts input control word 1008 into control code 1010 to create a linear output power in dBm as a function of control code curve similar to FIG. 4. If, for example, DAC 1004 is an 8-bit DAC, lookup table 1002 would have 512 entries, 256 for use when DAC 1004 is controlling $V_2$ 830 and 256 others for use when DAC 1004 is controlling $V_1$ 828. In this example, input control word 1008 would include nine (9) bits, one bit to select between $V_2$ 830 and $V_1$ 828 and eight (8) bits for the control code for the selected control voltage.

A CMOS transmitter in accordance with the present invention eliminates several problems in prior art implementations.

In prior art implementations, inherent current-to-voltage conversions and voltage-to-current conversions introduce undesirable nonlinearities. These conversions also cause undesirable increases in power consumption and in noise, and these conversions have the undesirable side effect of increasing the number of devices needed in an integrated circuit. A CMOS transmitter in accordance with the present invention eliminates these problems by operating in the current mode and thereby eliminating all current-to-voltage and all voltage-to-current conversions.

Furthermore, prior art VGAs that did not use bipolar junction transistors could not provide a linear power output per in dBm as a function of control code curve for controlling power output. A current cancelling VGA in accordance with the present invention solves this problem.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A communication device comprising:
  a low pass filter operable to output a filtered signal;
  a CMOS variable gain amplifier operable to receive an input current based on the filtered signal and to output an output current without performing a current-to-voltage conversion and without performing a voltage-to-current conversion:
  a digital-to-analog converter operable to receive a digital signal and output an analog signal; and
  a mixer operable to mix the filtered signal with a local oscillating signal and output the input current, wherein said low pass filter is arranged to receive the analog signal.

2. The communication device of claim 1:
  wherein said CMOS variable gain amplifier comprises a first leg and a second leg;
  wherein said first leg, includes a first input line, a first output line, a first ON transistor portion, a first control transistor portion and a first subtracting transistor portion;
  wherein said second leg includes a second input line, a second output line, a second ON transistor portion, a second control transistor portion and a second subtracting transistor portion, said second input line being operable to provide a second input current, said second output line being operable to provide a second output current;
  wherein said first input line is arranged to provide a first input current to each of said first ON transistor portion, said first control transistor portion and said first subtracting transistor portion;
  wherein said second input line is arranged to provide a second input current to each of said second ON transistor portion, said second control transistor portion and said second subtracting transistor portion;
  wherein said first output line is in electrical connection with each of said first ON transistor portion, said first control transistor portion and said second subtracting transistor portion; and
  wherein said second output line is in electrical connection with each of said second ON transistor portion, said second control transistor portion and said first subtracting, transistor portion.

3. The communication device of claim 2, wherein said first ON transistor portion, said second ON transistor portion, said first control transistor portion, said first subtracting transistor portion, said second control transistor portion and said second subtracting transistor portion comprises NMOS transistors.

4. The communication device of claim 2:
  wherein said digital-to-analog converter, said low pass filter, said mixer and said CMOS variable gain amplifier are arranged in one of a first state and a second state;
  wherein in the first state, current is able to travel from said digital-to-analog converter to said low pass filter, from said low pas filter to said mixer and from said mixer to said CMOS variable gain amplifier;
  wherein in the first state, said digital-to-analog converter and said mixer comprise PMOS transistors and said CMOS variable gain amplifier comprises NMOS transistors;
  wherein in the second state, current is able to travel from said CMOS variable gain amplifier to said mixer, from said mixer to said low pass filter and from said low pass filter to said digital-to-analog converter; and
  wherein in the second state, said digital-to-analog convener and said mixer comprise NMOS transistors.

5. A communication device comprising:
  a low pass filter operable to output a filtered signal;
  a CMOS variable gain amplifier operable to receive an input current based on the filtered signal and to an output current without performing a current-to-voltage conversion and without performing a voltage-to-current conversion;
wherein said CMOS variable gain amplifier comprises a first leg and a second leg;
wherein said first leg includes a first input line, a first output line, a first ON transistor portion, a first control transistor portion and a first subtracting transistor portion;
wherein said second leg includes a second input line, a second output line, a second ON transistor portion, a second control transistor portion and a second subtracting transistor portion, said second input line being operable to provide a second input current, said second output line being operable to provide a second output current;
wherein said first input line is arranged to provide a first input current to each of said first ON transistor portion, said first control transistor portion and said first subtracting transistor portion;
wherein said second input line is arranged to provide, a second input current to each of said second ON transistor portion, said second control transistor portion and said second subtracting transistor portion;
wherein said first output line is in electrical connection with each of said first ON transistor portion, said first control transistor portion and said second subtracting transistor portion; and
wherein said second output line is in electrical connection with each of said second ON transistor portion, said second control transistor portion and said first subtracting transistor portion.

6. The current canceling CMOS variable gain amplifier of claim 2:
wherein said first ON transistor portion comprises an integer n transistors;
wherein said second ON transistor portion comprises the integer n transistors;
wherein said first control transistor portion comprises an integer m transistors, wherein said first subtracting transistor portion comprises an integer m transistors;
wherein said second control transistor portion comprises an integer m transistors, wherein said second subtracting transistor portion comprises an integer m transistors; and
wherein n>m.

7. The current canceling CMOS variable gain amplifier of claim 6:
wherein n=51, and
wherein m=50.

8. The current canceling CMOS variable gain amplifier of claim 6, wherein said first subtracting transistor portion is connected to said second subtracting transistor portion.

9. The current canceling CMOS variable gain amplifier of claim 8, wherein said first ON transistor portion, said second ON transistor portion, said first control transistor portion, said first subtracting transistor portion, said second control transistor portion and said second subtracting transistor portion comprises NMOS transistors.

10. The current canceling CMOS variable gain amplifier of claim 8, wherein said first ON transistor portion, said second ON transistor portion, said first Control transistor portion, said first subtracting transistor portion, said second control transistor portion and said second subtracting transistor portion comprises PMOS transistors.

11. The current canceling CMOS variable gain amplifier of claim 2, wherein said first subtracting transistor portion is connected to said second subtracting transistor portion.

12. The current canceling CMOS variable gain amplifier of claim 11, wherein said first ON transistor portion, said second ON transistor portion, said first control transistor portion, said first subtracting transistor portion, said second control transistor portion and said second subtracting transistor portion comprises NMOS transistors.

13. The current canceling CMOS variable gain amplifier of claim 12, wherein said first ON transistor portion, said second ON transistor portion, said first control transistor portion, said first subtracting transistor portion, said second control transistor portion and said second subtracting transistor portion comprises PMOS transistors.

14. The current canceling CMOS variable gain amplifier of claim 2, wherein said first ON transistor portion, said second ON transistor portion, said first control transistor portion, said first subtracting transistor portion, said second control transistor portion and said second subtracting transistor portion comprises NMOS transistors.

15. The current canceling CMOS variable gain amplifier of claim 2, wherein said first ON transistor portion, said second ON transistor portion, said first control transistor portion, said first subtracting transistor portion, said second control transistor portion and said second subtracting transistor portion comprises PMOS transistors.

16. A communication device comprising:
a filter operable to output a filtered signal;
a variable gain amplifier operable to receive an input current based on the filtered signal and to output an output current without performing a current-to-voltage conversion and without performing a voltage-to-current conversion;
a converter operable to receive a digital signal and output an analog signal; and
a mixer operable to mix the filtered signal with a local oscillating signal and output the input current, wherein said filter is arranged to receive the analog signal.

17. A communication device comprising:
means operable to output a filtered signal;
means operable to receive an input current based on the filtered signal and to output an output current without performing a current-to-voltage conversion and without performing a voltage-to-current;
means operable to receive a digital signal and output an analog signal; and
means operable to mix the filtered signal with a local oscillating signal and output the input current, wherein said low pass filter is arranged to receive the analog signal.

* * * * *